(12) United States Patent  
Tanahara

(10) Patent No.: US 8,462,308 B2  
(45) Date of Patent: Jun. 11, 2013

(54) ARRAY SUBSTRATE HAVING CONNECTION WIRINGS

(75) Inventor: Manabu Tanahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 623 days.

(21) Appl. No.: 12/646,200

(22) Filed: Dec. 23, 2009

(65) Prior Publication Data

US 2010/0163284 A1 Jul. 1, 2010

(30) Foreign Application Priority Data

Dec. 25, 2008 (JP) ................ 2008-330326

(51) Int. Cl.  
*G02F 1/1333* (2006.01)  
*G02F 1/1345* (2006.01)

(52) U.S. Cl.  
USPC ........... 349/152; 349/40; 349/151; 257/59; 257/72

(58) Field of Classification Search  
USPC ............. 349/40, 140, 151, 152; 257/59, 72  
See application file for complete search history.

(56) References Cited

U.S. PATENT DOCUMENTS

| 5,929,958 | A * | 7/1999 | Ohta et al. ............. 349/141 |
| 6,894,758 | B1 * | 5/2005 | Hagiwara et al. ........ 349/152 |
| 2001/0055085 | A1 * | 12/2001 | Jinno et al. ........... 349/139 |
| 2009/0033609 | A1 * | 2/2009 | Ashizawa et al. ........ 345/92 |
| 2009/0195721 | A1 | 8/2009 | Tanahara |
| 2009/0225269 | A1 * | 9/2009 | Lu et al. .............. 349/158 |

FOREIGN PATENT DOCUMENTS

JP 11-119246 4/1999

OTHER PUBLICATIONS

Japanese Office Action issued Aug. 9, 2011, in Patent Application No. 2008-330326. (with English translation).  
U.S. Appl. No. 13/398,129, filed Feb. 16, 2012, Tanahara, et al.  
Office Action issued Apr. 19, 2011, in Japanese Patent Application No. 2008-330326 with English translation.

* cited by examiner

*Primary Examiner* — Michael Caley  
(74) *Attorney, Agent, or Firm* — Oblon, Spivak, McClelland, Maier & Neustadt, L.L.P.

(57) ABSTRACT

An array substrate comprises on an insulative substrate, a plurality of display areas to be portions of a plurality of display panels, in which, each display area is constituted with a plurality of pixels arranged in a matrix, and the pixels is constituted with pixel electrodes formed at intersection portions of plural scan wirings and plural signal wirings; a common wiring is formed outside each display area, for applying a reference voltage to the pixels; a plurality of external-connection terminals is formed outside each display area, to be connected with a driver circuit that drives; and comprises connection wirings located so as to intersect a cutting line along which the insulative substrate is to be cut, for connecting the external-connection terminals in one of the display panels on the insulative substrate with a common wiring in another one of the display panels adjacent to the external-connection terminals, wherein the connection wirings are formed in a conductive layer superior in corrosion resistance to the most inferior corrosion-resistance conductive layer among conductive layers constituting the array substrate.

16 Claims, 11 Drawing Sheets

ARRAY SUBSTRATE HAVING CONNECTION WIRINGS

FIELD OF THE INVENTION

The present invention relates to an array substrate, and a display device and its manufacturing method. More particularly, the invention relates, in a case where a plurality of display panels, each being a major part of the display device, are formed on a mother substrate to form the array substrate, to an anti-static configuration of the array substrate on which formed are various wirings, thin film transistors, pixel electrodes, and the likes, and to an anti-corrosion configuration of the display device.

BACKGROUND ART

In recent years, display devices have been used in various apparatus as information display means for viewers. A new display panel (a major part of a display device, excluding an external circuit, a casing, and the like) that utilizes liquid crystal, plasma, electro-luminescence, field emission, or the like, becomes the mainstream of typical display devices now, in place of a Braun tube that was popularly utilized for display devices before. The new display panel generally has a flat display area in which a plurality of pixels, each being a basic unit for image formation in the display area, is arranged in a matrix, and is a type of display panel that enables the display device to be small in thickness. Hence, the new display device is also called "flat panel display" as a generic term.

Taking as an example an active-matrix liquid-crystal display device, which is a most typical display device now, a plurality of display areas are formed on a mother substrate made of an insulative material such as transparent glass or plastic. In each display area, pluralities of scan wirings and signal wirings are arranged in matrix patterns, and at their intersection points, thin film transistors, i.e., switching elements and pixels having pixel electrodes are arranged in a matrix. Through steps of forming them, the mother substrate is fabricated into an array substrate with the scan wirings, the signal wirings, the pixel electrodes, and various other wirings, terminals, and the likes formed thereon. The array substrate and its opposite substrate are bonded together with a gap of several μm, and cut and separated on a display area basis, thereby to obtain a plurality of liquid crystal panels (display panels). The gap is filled with a liquid crystal material. In addition, there are two methods of filling a liquid crystal: one is a one-drop fill method that is applied before an opposite substrate is bonded; and the other is a vacuum injection method that is applied after bonded.

In manufacturing steps prior to those of cutting and separating the array substrate and mounting a driver circuit and an external circuit, there has been a discharge breakdown problem that a short circuit or a break occurs in a scan wiring or a signal wiring formed on the array substrate owing to an external static electricity, or there has been a discharge breakdown problem of a gate insulation film that causes a change in characteristic such as a threshold level of the thin film transistor.

As a way to solve the above-mentioned problem, a configuration has been disclosed in, for example, JP Unexamined Patent Publication No. H11-119246A, in which an anti-static short wiring (short ring) that is commonly connected with plural scan-wiring leads and signal-wiring leads is provided in the vicinity of a cutting line along which the array substrate is to be cut into individual liquid crystal panels. The common connection with the scan wirings and the signal wirings, even if static electricity happens to occur therein, discharges its charge to diminish the potential difference between the wirings, which brings about an effect that a discharge breakdown is less likely to occur between the wirings.

As a rule, the short-wiring-formed area is disposed off, when the mother substrate is cut and separated into the plurality of display panels.

However, from the viewpoint of cost reduction of the display device, it is desirable to obtain the display panels as many as possible from one mother substrate. The short-wiring formed area to be disposed off are, as a matter of course, unusable for the display panel, which has caused a problem of reducing the number of display panels obtained from one mother substrate.

Moreover, if connection wirings that connect scan-wiring leads or signal-wiring leads to a short wiring are formed from the same layer for the scan wirings or the signal wirings by being directly extended from external-connection terminals for the scan wirings or the signal wirings, the connection wirings are usually located to intersect the cutting line along which the display panels are to be cut and separated from their mother substrate. As a result, the layer of the scan wirings or the signal wirings, i.e., the connection wiring layer is exposed on the cut end.

While scan wirings or signal wirings are generally formed of a metal film of low ohmic resistance, the low resistance metal film is likely to corrode under high temperature and high humidity environment. For this reason, if the connection wirings are formed of such a low resistance metal film, corrosion occurs, depending upon a use environment of the display device, beginning from the connection wirings exposed on the cut end, and gradually progresses to the external-connection terminals of the array substrate and further to the leads, resulting in a reliability problem such as a malfunction due to a break in a wiring during operation of the display device.

SUMMARY OF THE INVENTION

The present invention aimed at providing an array substrate that has a configuration able to obtain more display panels from one mother substrate.

The invention is also aimed at improving reliability of a display device that is assembled from the display panel having been cut and separated from the array substrate.

An array substrate of the present invention comprises on an insulative substrate, a plurality of display areas to be portions of a plurality of display panels, in which each display area is constituted with a plurality of pixels arranged in a matrix, and the pixels is constituted with pixel electrodes formed at intersection portions of plural scan wirings and plural signal wirings; a common wiring is formed outside each display area, for applying a reference voltage to the pixels; a plurality of external-connection terminals is formed outside each display area, to be connected with a driver circuit that drives; and comprises connection wirings located so as to intersect a cutting line along which the insulative substrate is to be cut, for connecting the external-connection terminals in one of the display panels on the insulative substrate with a common wiring in another one of the display panels adjacent to the external-connection terminals, wherein the connection wirings are formed in a conductive layer superior in corrosion resistance to the most inferior corrosion-resistance conductive layer among conductive layers constituting the array substrate.

A method for fabricating a plurality of display devices comprises the steps of: preparing an array substrate having on an insulative substrate: a plurality of display areas to be portions of a plurality of display panels, each display area being constituted with a plurality of pixels arranged in a matrix, the pixels having pixel electrodes formed at intersection portions of plural scan wirings and plural signal wirings, a common wiring formed outside each display area for applying a reference voltage to the pixels, a plurality of external-connection terminals formed outside each display area, to be connected with a driver circuit that drives the display panel, and connection wirings located so as to intersect a cutting line along which the insulative substrate is to be cut, for connecting the external-connection terminals in one of the display panels on the insulative substrate with a common wiring in another one of the display panels adjacent to the external-connection terminals; bonding the array substrate together with an opposite substrate with a gap therebetween; and cutting the bonded array substrate and opposite substrate along the cutting line to separate the bonded substrates individually for the respective display areas, to provide a plurality of display panels.

DESCRIPTION OF THE PREFERRED EMBODIMENTS

Embodiments for an array substrate and a display device of the present invention will be described hereinafter with reference to the accompanying drawings. In each drawing for explaining the embodiments below, the same numerals designate like elements or equivalent portions; hence, repetition of similar drawings and their explanations is properly omitted.

Embodiment 1

Figure 1:
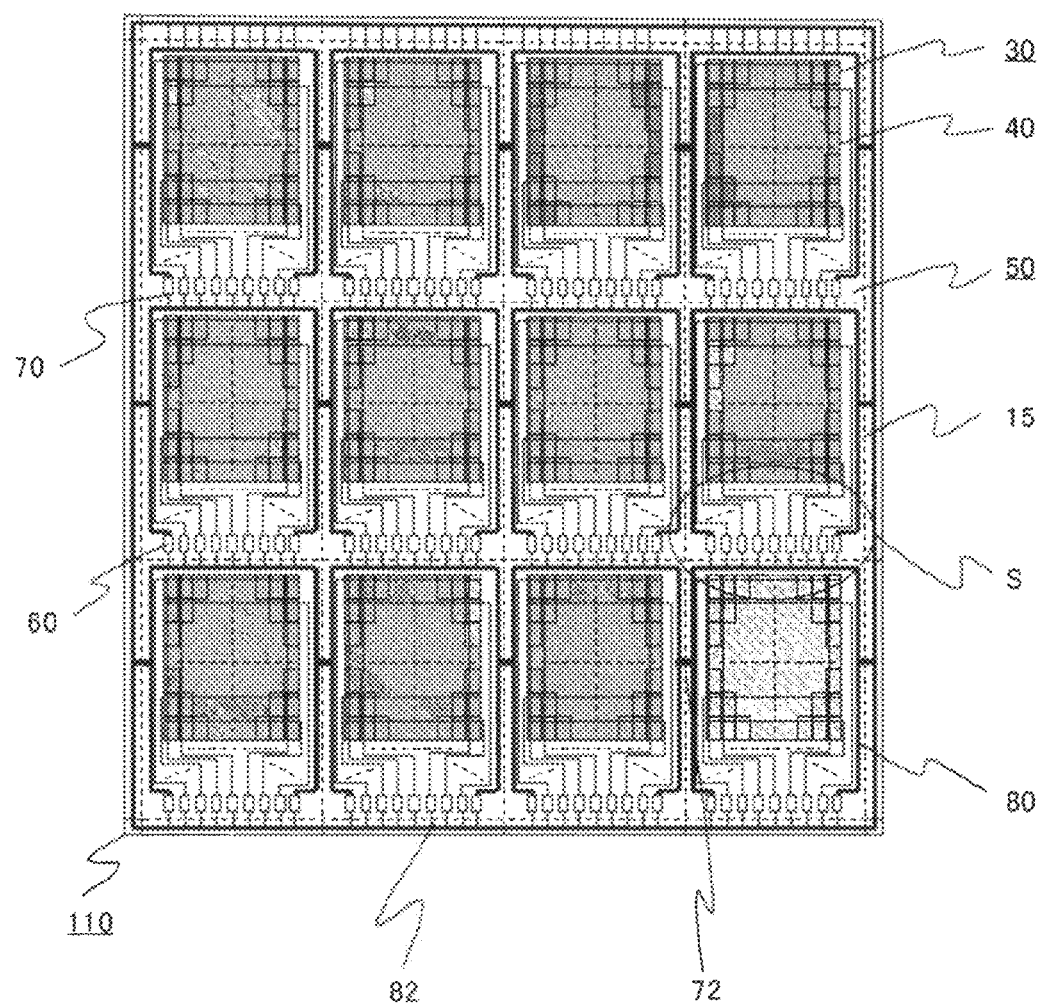
FIG. 1 is a plan view illustrating a schematic configuration of an array substrate in Embodiment 1 of the present invention, for a plurality of liquid crystal panels to be arranged thereon.
Figure 2:
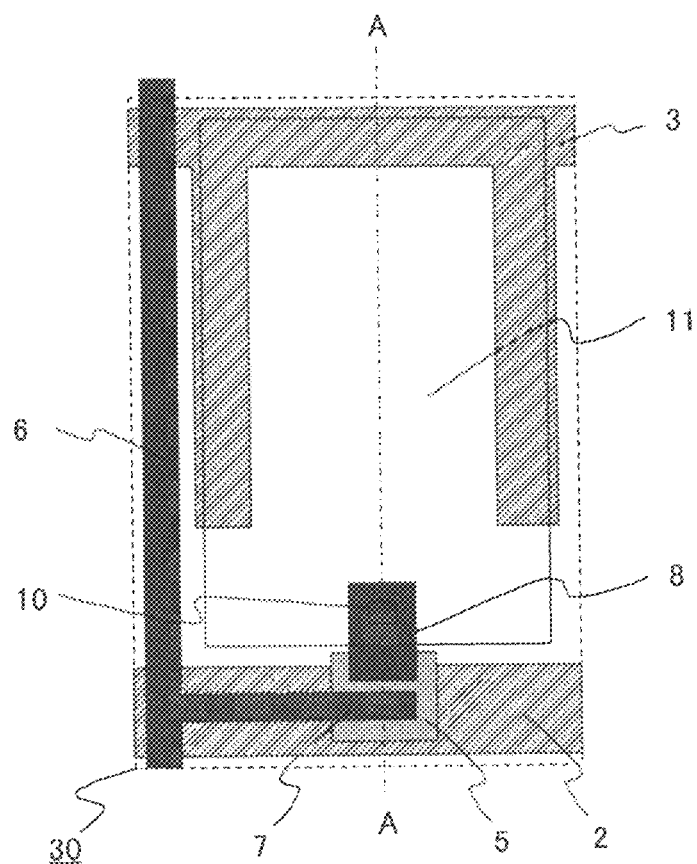
FIG. 2 is an enlarged plan view illustrating one of pixels formed on the array substrate shown in FIG. 1, which constitute the display area of each liquid crystal panel.
Figure 3:
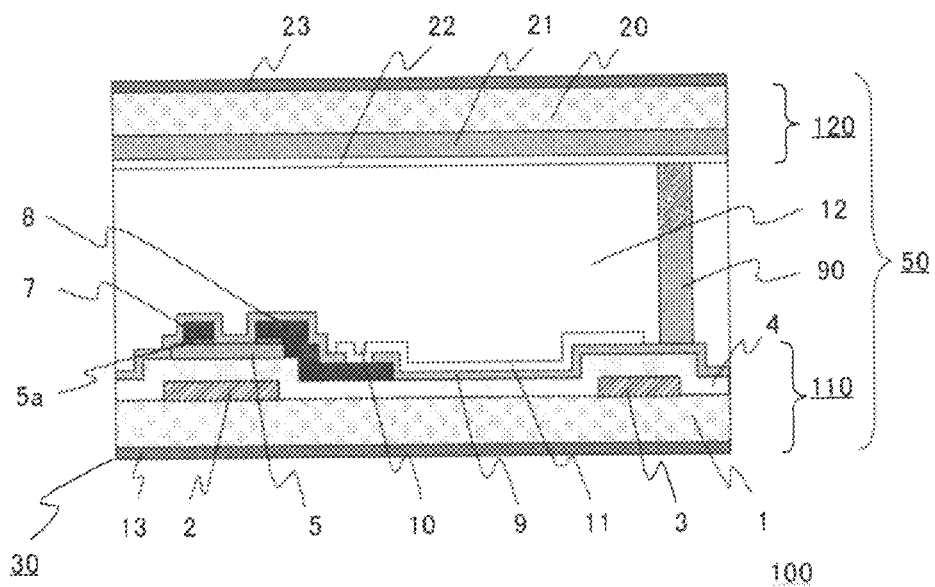
FIG. 3 is a cross-sectional view along the A-A line shown in FIG. 2.
Figure 4:
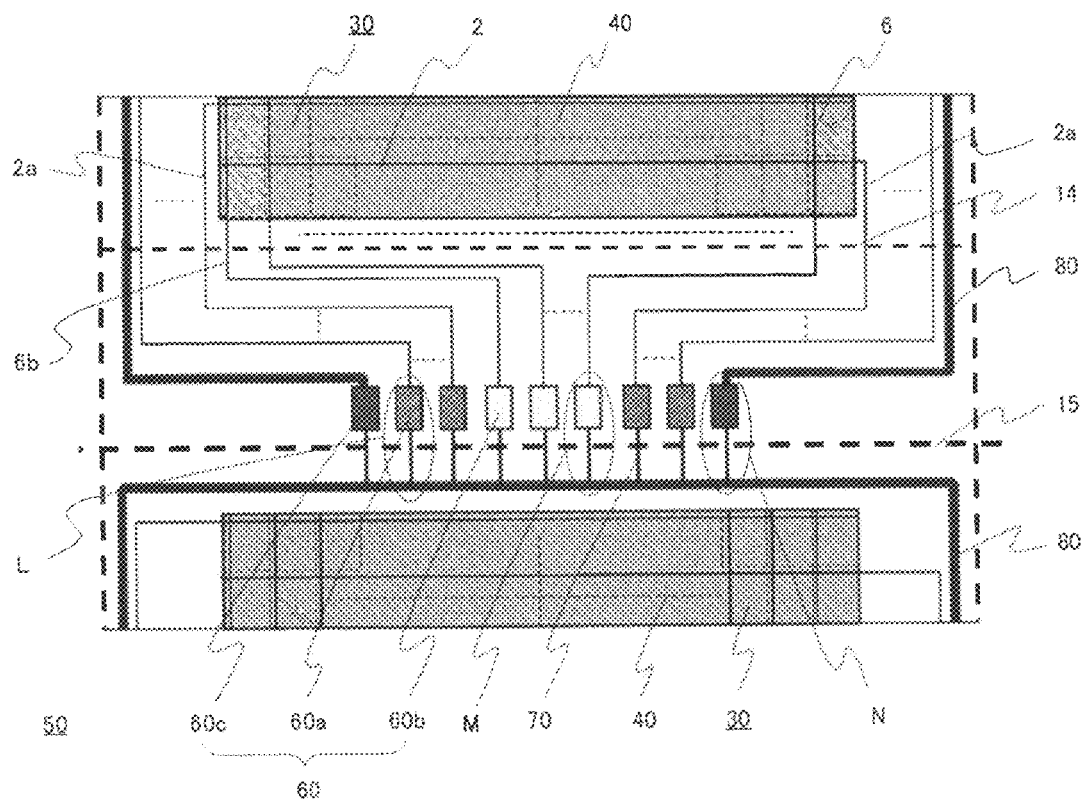
FIG. 4 is an enlarged plan view illustrating a region S around a cutting line of the array substrate in Embodiment 1, along which to cut the array substrate into individual vertically-adjacent liquid-crystal panels.

Embodiment 1 of the invention is a case of the display device being a liquid crystal display device. FIG. 1 is a plan view illustrating a schematic configuration of an array substrate of Embodiment 1, for a plurality of liquid crystal panels to be arranged thereon. FIG. 2 is an enlarged plan view illustrating one of pixels formed on the array substrate shown in FIG. 1, which constitute the display area of each liquid crystal panel. FIG. 3 is a cross-sectional view along the A-A line shown in FIG. 2. FIG. 4 is an enlarged plan view of a region S around a cutting line along which the array substrate is to be cut into the individual vertically-adjacent liquid crystal panels.

In FIGS. 1 to 3, an array substrate 110, on which formed is a plurality of display areas 40 (twelve panels, here) each having a plurality of pixels 30 arranged in a matrix, and an opposite substrate (color filter substrate) 120 are disposed facing to each other and spaced with a gap of approximately 2 to 5 μm by a resin spacer 90. The gap is filled with a liquid crystal 12. Then, the substrates disposed are cut along cutting lines 15 and separated into a plurality of liquid crystal panels 50 (twelve panels, here). Although not shown in the figures, each liquid crystal panel 50 is assembled into a liquid crystal display device 100 in the post steps such as of mounting and connecting a driver circuit (driver IC) and an external circuit, and housing in a casing.

Connection wirings 70 here connect external-connection terminals 60 that are formed on the array substrate 110, which is one substrate of the liquid crystal panel 50, to a common wiring 80 of an adjacent liquid crystal panel 50 before the substrate is cut and separated along the cutting lines 15. In FIG. 1, the external-connection terminals 60 are connected to the common wiring 80 of the under adjacent liquid crystal panel 50. In the vicinity of the outermost periphery of the array substrate 110 before being cut and separated, a short ring 82 is provided and connected with common wirings 80. In FIG. 1, auxiliary connection wirings 72 are further provided for connection between respective common wirings 80 of right-and-left adjacent liquid crystal panels 50.

A manufacturing method of the array substrate 110 and the liquid display device 100 of Embodiment 1 and their configurations will be briefly described below. Here described are a most common five-mask manufacturing process of an amorphous-silicon thin-film-transistor type liquid-crystal panel, and its configuration. First of all, a first thin metal film is deposited of a metal such as Al, Cu, Cr, Mo, Ta, Ti, or W, or an alloy of any thereof by sputtering or the like, on an insulative substrate 1 that is a mother substrate made of glass, plastic, or the like, to form predetermined patterns of scan wirings 2, a common electrode 3 that forms auxiliary capacitance, and the like.

Next, a gate insulation film 4 made of SiNx, SiOx, or the like, a semiconductor functional film 5, and an ohmic contact film 5a are successively deposited by plasma CVD or the like. Then, the semiconductor functional film 5 and the ohmic contact film 5a are formed into predetermined patterns. The patterns here are rectangular islands.

A second thin metal film is subsequently deposited of a metal such as Al, Cu, Cr, Mo, Ta, Ti, or W, or an alloy of any thereof by sputtering or the like, and then formed into determined patterns of signal wirings 6, source electrodes 7, drain electrodes 8, a common wiring 80 and the like. The common wiring 80, which are connected with the common electrode 3, is applied with a reference voltage (mean voltage) for AC-driving the liquid crystal 12 in the liquid crystal panel 50.

Next, a protective film 9 is deposited of SiNx, SiOx, or the like by plasma CVD or the like, and then, contact holes 10 on the drain electrodes 8 are formed therein. At this time, later-described other contact holes are also formed in each of the external-connection terminals 60 for the scan wirings 2, for the signal wirings 6, and for the common wiring 80, and even in other portions such as transit portions and connecting portions.

Next, pixel electrodes 11 are deposited on the protective film 9 by sputtering or the like. The pixel electrodes 11 are connected with the drain electrodes 8 through the contact holes 10 formed in the protective film 9. If the liquid-crystal display device 100 is of a transmissive type, the pixel electrodes 11 are formed of a transparent conductive oxide film such as indium tin oxide (ITO). The overlapped portions between the common electrode 3 and the pixel electrodes 11 serve as retention capacitances.

If the liquid crystal display device is of a reflective type, the pixel electrodes 11 are formed of a film of high reflective metal such as Al or Ag. If the liquid crystal display device is of a transflective type, each of the pixel electrodes 11 is formed not of one portion with one material but of two portions with a transparent conductive oxide film and a high reflective metal film.

Next, the opposite substrate 120 having, on a glass plate 20, color filters 21 of red, blue, green, and the like, and an opposite electrode 22 formed of a transparent conductive oxide film such as of ITO, is placed facing the array substrate 110 that forms thereon the plurality of display areas 40, and spaced with a gap of 2 to 5 μm by resin spacers 90, and then, the periphery of the display area 40 is bonded with the opposite substrate by sealant, and the liquid crystal 12 is filled into the gap. After that, by cutting and separating a mother substrate (here referred to the bonded state of the array substrate 110 and the opposite substrate 120), the plurality of liquid crystal panels 50 (twelve panels in FIG. 1) are fabricated.

In many cases, the opposite substrate 120 is constituted with a glass plate 20 that is a mother substrate substantially the same size as the array substrate 110. The array substrate 110 and the opposite substrate 120 having been bonded with each other are cut along a cutting line 15 and separated into the plurality of liquid crystal panels 50.

If the liquid crystal display device is of a transflective type, a transparent resin planarizing film may sometimes be formed between the color filters 21 and the opposite electrode 22, for adjusting a gap in the reflective regions, in order to improve evenness of the liquid-crystal-filled gap between the array substrate 110 and the opposite substrate 120. Note that, in an in-plane switching (IPS) type, the opposite electrode 22 is formed on the array substrate 110.

Note that a portion of the opposite substrate 120 that faces the region of the external-connection terminals 60 and the like formed outside the display area 40 on the array substrate 110, is cut along an opposite-substrate cutting line 14 to be removed from the liquid crystal panel 50, in order for the circuit (driver IC) and the external circuit to be connect with wirings in the region.

Although not shown in FIG. 3, alignment film is applied to the inner surfaces of the array substrate 110 and the opposite substrate 120, to regulate molecular orientation of the liquid crystal 12, and polarizing plates 13 and 23 are applied to the front and the back faces of the liquid crystal panel 50. Also not shown in the figures, the driver circuit and the external circuit are mounted and connected, to drive the liquid crystal panel 50. In a transmissive type, a backlight is disposed on the backside of the liquid crystal panel 50. The liquid crystal panel 50 is further assembled such as housed in the casing, and finally, the liquid crystal display device 100 is completed.

An explanation will be made with reference to FIG. 4 on the enlarged plan view of the region S, a main portion of this invention, around the cutting line of the array substrate. In FIG. 4, the external-connection terminals (connection terminals for a flexible substrate) 60, i.e., external-connection terminals 60a, 60b, and 60c are arranged in one line and connected with scan-wiring leads 2a, signal-wiring leads 6b, and the common wiring 80, respectively. Moreover, the connection wirings 70 are extended from the external-connection terminals 60 and connected with the other common wiring 80 of the adjacent liquid crystal panel 50 (lower one in the figure).

In addition, the scan-wiring leads 2a here are configured to be drawn out alternately from the right and left sides of the display area 40 according to whether they are from even-numbered scan wirings 2 or odd-numbered ones.

Connecting the connection wirings 70 with the common wiring 80 of the adjacent liquid crystal panel 50 results in that the scan wirings 2 and the signal wirings 6 are connected to the common wiring 80, so that the common wiring 80 of the adjacent liquid crystal panel 50 serves as a short ring (short wiring). This eliminates a need to provide, as done conventionally, an extra area between the external-connection terminals and the adjacent liquid crystal panels 50, for forming a short ring. Accordingly, more liquid crystal panels 50 can be obtained from one mother substrate (here referred to the bonded state of the array substrate 110 and the opposite substrate 120), because there are less portions to be disposed off when the mother substrate is cut and separated along the cutting line 15.

Figure 5:
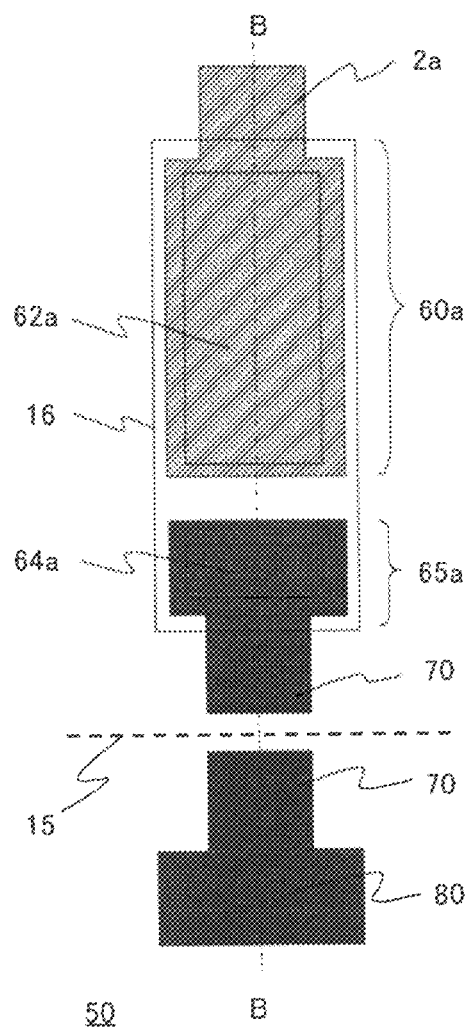
FIG. 5 is an enlarged plan view illustrating an external-connection terminal portion L in Embodiment 1, for scan wirings.
Figure 6:
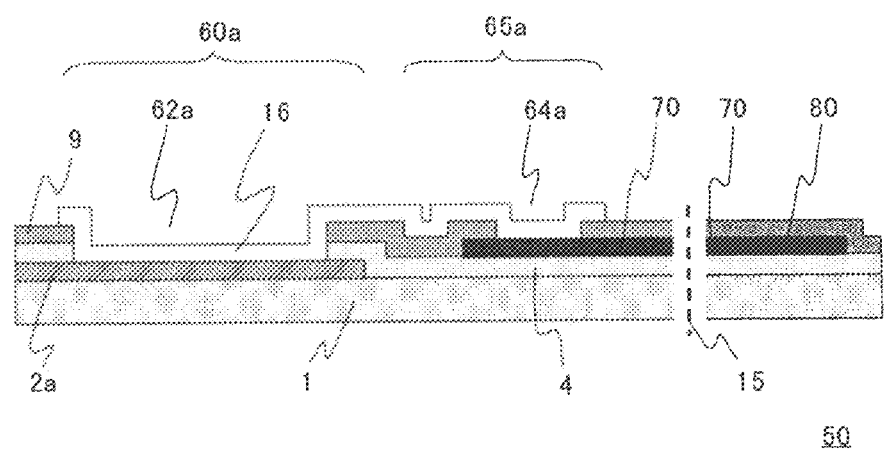
FIG. 6 is a cross-sectional view along the B-B line shown in FIG. 5.

The external-connection terminals 60a for the scan wirings 2 will be explained. FIG. 5 is an enlarged plan view illustrating an external-connection terminal portion L for the scan wirings 2. FIG. 6 is a cross-sectional view along the B-B line shown in FIG. 5.

An external-connection terminal 60a for a scan wiring 2 and a scan-wiring lead 2a has a two-layer structure. The lower-layer film is formed from the same layer for the scan wirings 2 and the scan-wiring leads 2a, and the upper-layer film, i.e., an external-connection terminal surface film 16 is formed from the same layer for the pixel electrodes 11 formed of a transparent conductive oxide film such as of ITO that is superior in corrosion resistance to a metal film. The external-connection terminal surface film 16 is in contact with the lower-layer film through a contact hole 62a formed in the gate insulation film 4 and the protective film 9. On the other hand, the connection wirings 70 to be connected to the common wiring 80 of the adjacent liquid crystal panel 50 are formed from the same layer of the signal wirings 6 and the signal-wiring leads 6b. The external-connection terminal surface film 16 is extended to connect a connection wiring 70 with the external-connection terminal 60a for the scan wiring 2 at a transit portion 65a through a contact hole 64a formed in the protective film 9.

The connection wiring 70 is extended and connected directly with the common wiring 80 of the adjacent liquid crystal panel 50. The common wiring 80 here are formed from the same layer for the signal wirings 6 and the signal-wiring leads 6b, and the cutting line 15 is located so as to intersect the connection wirings 70, along which the array substrate is to be cut into the plurality of liquid crystal panels 50.

Effects of the configuration in this embodiment will be described here. An important feature of the configuration is that the conductive film forming the connection wirings 70 is superior in corrosion resistance to that forming the scan wirings 2. In other words, in Embodiment 1, the conductive film forming the signal wirings 6 is superior in corrosion resistance to that forming the scan wirings 2. That is a case of, for example, the scan wirings 2 being made of a metal such as Al, Ag, or Cu, and the signal wirings 6 being made of a more corrosion-resistant metal such as Cr, Mo, Ti, Ta, or W.

Moreover, in this configuration, by locating the cutting line 15, along which the liquid crystal panel 50 is to be cut and separated from the mother substrate, so as to intersect the connection wirings 70, the more corrosion-resistance layer of the connection wirings 70 (the same layer for the signal wirings 6 in this case) is exposed on the cut end, so that corrosion is less likely to occur than the layer of the scan wirings 2 is exposed. Therefore, the display device 100 is improved in reliability.

Furthermore, since the connection wirings 70 are covered with the protective film 9 in this configuration, the layer of the connection wirings 70 is hard to peel in the cutting and separating step. Moreover, even if a connection wiring 70 is peeled or corroded, influence of the peeling or corrosion can be prevented from extending to an external-connection terminal 60a connected therewith because a transit portion 65a is provided there. Therefore, the display device 100 is further improved in reliability.

Figure 7:
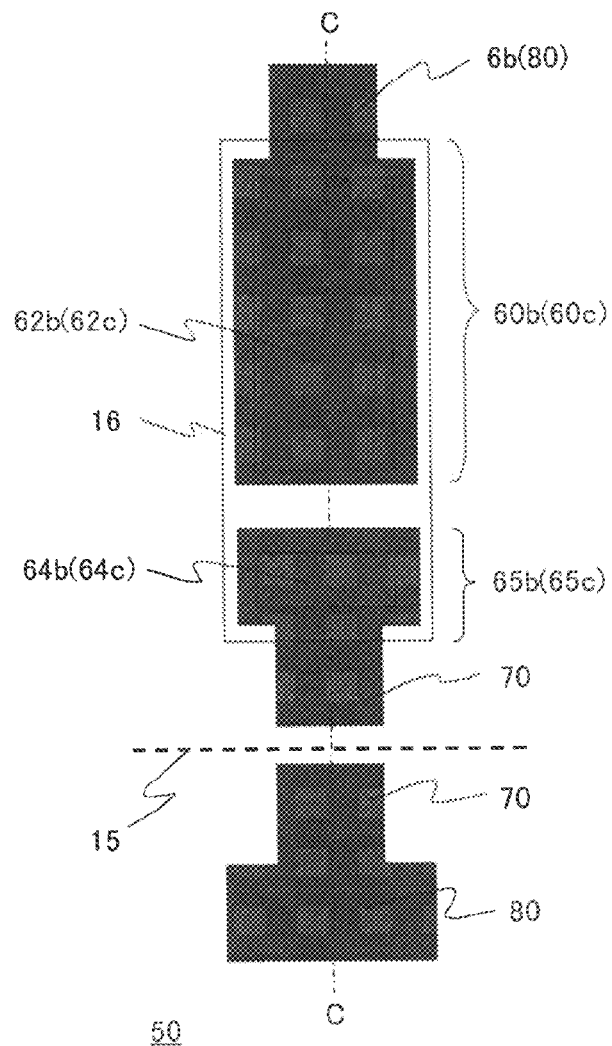
FIG. 7 is an enlarged plan view illustrating an external-connection terminal portion M or N in Embodiment 1, for signal wirings or common wirings.
Figure 8:
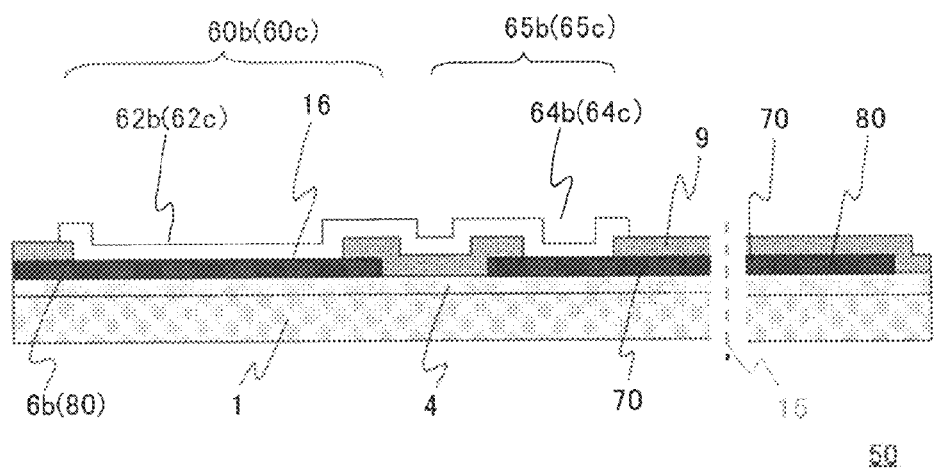
FIG. 8 is a cross-sectional view along the C-C line shown in FIG. 7.

Next, an explanation will be made on the external-connection terminals 60b for the signal wirings 6 and the external-connection terminals 60c for the common wiring 80. FIG. 7 is an enlarged plan view illustrating an external-connection terminal portion M or N for a signal wiring 6 or the common wiring 80. FIG. 8 is a cross-sectional view along the C-C line shown in FIG. 7.

While an external-connection terminal 60b for a signal wiring 6 and a signal-wiring lead 6b, and an external-connection terminal 60c for the common wiring 80 have a two-layer structure as with the external-connection terminal 60a, the lower-layer film is formed from the same layer for the signal wirings 6, for the signal-wiring leads 6b, and for the common wiring 80, and the upper-layer film, i.e., an external-connection terminal surface film 16 are formed from the same layer for the pixel electrodes 11 formed of a transparent conductive oxide film such as of ITO. The external-connection terminal surface film 16 is in contact with the lower-layer film through a contact hole 62b or 62c formed in the protective film 9. On the other hand, the connection wirings 70 to be connected to the common wiring 80 of the vertically adjacent liquid crystal panel 50 are formed from the same layer for the signal wirings 6, the signal-wiring leads 6b, and the common wiring 80. The external-connection terminal surface film 16 is connected with a connection wiring 70 through a contact hole 64b or 64c formed in the protective film 9 at a transit portion 65b or 65c. The connection wiring 70 and the lower-layer film of the external-connection terminal 60b or 60c, although formed from the same layer, are isolated from each other.

An important feature of this configuration is also that the conductive film forming the connection wirings 70 is superior in corrosion resistance to that forming the scan wirings 2, as with the external-connection terminals 60a forming the scan wirings 2, that is, the connection wiring 70 are formed from the same layer for the signal wirings 6, the signal-wiring leads 6b, and the common wiring 80.

In such a configuration, by locating the cutting line 15, along which the liquid crystal panel 50 is to be cut and separated from the mother substrate, so as to intersect the connection wirings 70, all the connection wirings 70 of the more corrosion-resistant layer (in this case, the same layer for the signal wirings 6) will be exposed on the cut end, so that corrosion is less likely to occur than the layer of the scan wirings 2 is exposed. Therefore, the display device 100 is improved in reliability.

Moreover, all the connection wirings 70, since covered with the protective film 9 in this configuration, are also hard to peel in the cutting step. Furthermore, even if a connection wiring 70 is to some degree peeled or corroded, influence of the peeling and corrosion can be prevented from extending to an external-connection terminal 60 connected therewith because the connection wirings 70 are separated from the lower-layer film of the external-connection terminals 60 and their transit portions 65 are provided there. Therefore, the display device 100 is further improved in reliability.

In addition, if the lower-layer film of the external-connection terminals 60b for the signal wirings 6 is formed from the same layer for the scan wirings 2, the terminals may be formed in the same configuration as that of the external-connection terminals 60a for the scan wirings 2, as shown in above-described FIGS. 5 and 6.

Similarly, if the lower-layer film of the external-connection terminals 60c for the common wiring 80 is formed from the same layer for the scan wirings 2, the terminals may also be formed in the same configuration as that of the external-connection terminals 60a for the scan wirings 2, as shown in above-described FIGS. 5 and 6.

Embodiment 2

Figure 9:
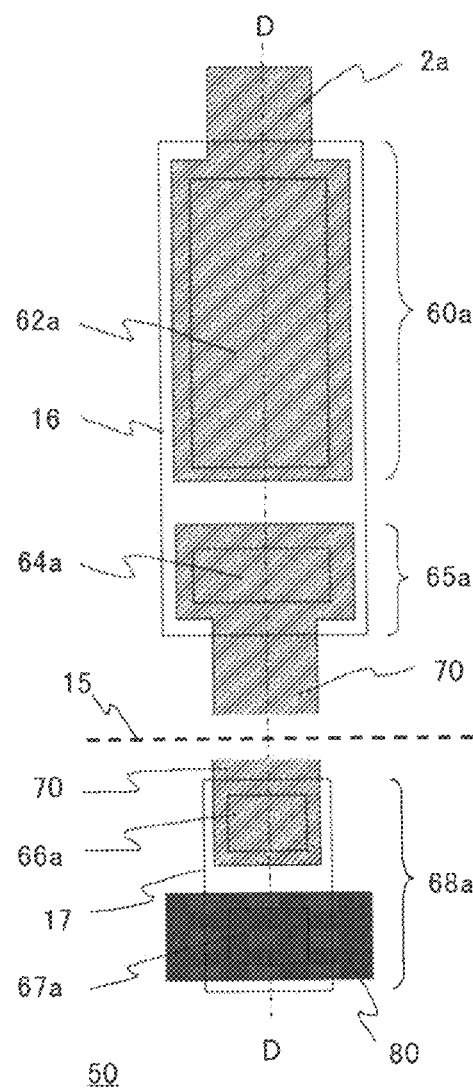
FIG. 9 is an enlarged plan view illustrating an external-connection terminal portion L in Embodiment 2, for scan wirings.
Figure 10:
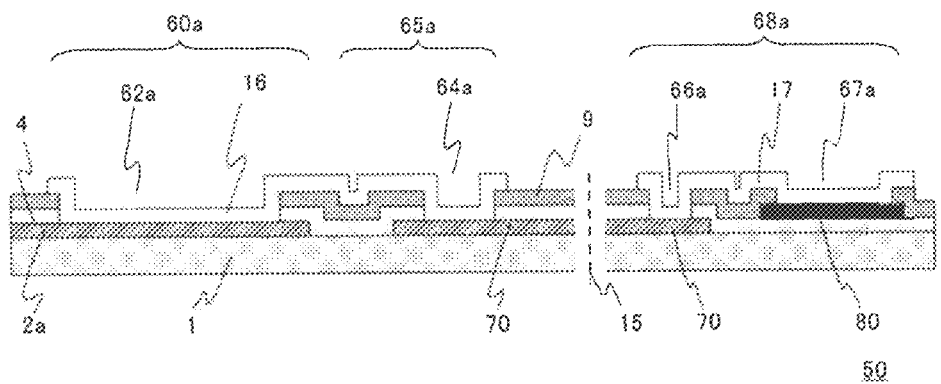
FIG. 10 is a cross-sectional view along the D-D line shown in FIG. 9.
Figure 11:
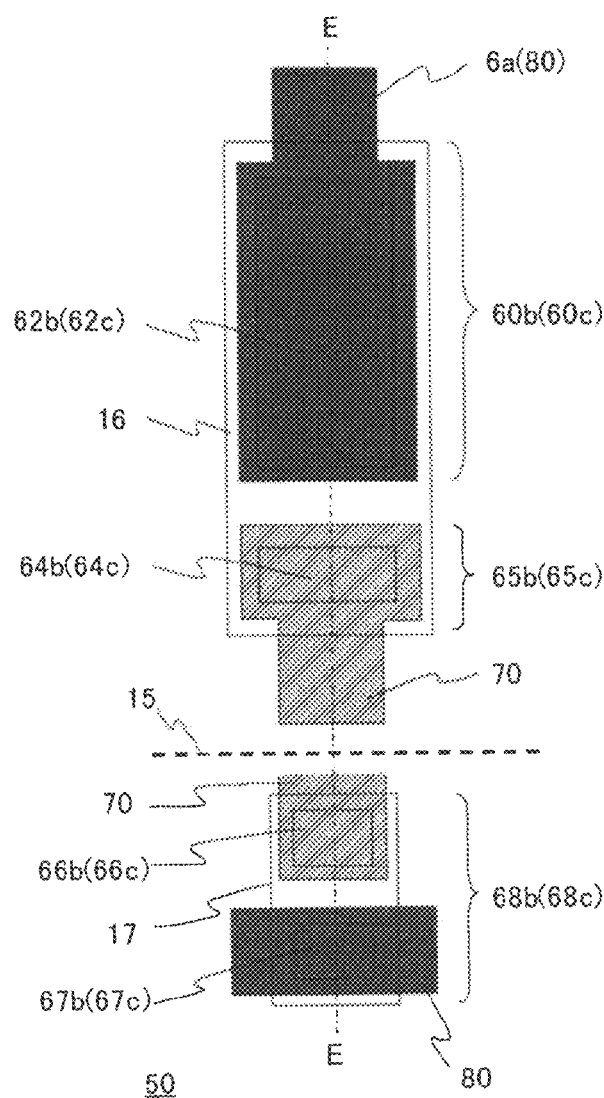
FIG. 11 is an enlarged plan view illustrating an external-connection terminal portion M or N in Embodiment 2, for the signal wirings or the common wirings.
Figure 12:
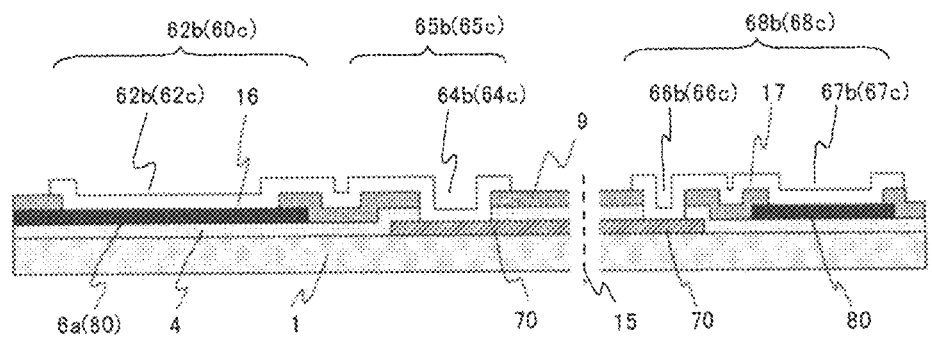
FIG. 12 is a cross-sectional view along the E-E line shown in FIG. 11.

FIG. 9 is an enlarged plan view illustrating an external-connection terminal portion L in Embodiment 2, for scan wirings. FIG. 10 is a cross-sectional view along the D-D line shown in FIG. 9. FIG. 11 is an enlarged plan view illustrating an external-connection terminal portion M or N in Embodiment 2, for signal wirings or a common wiring. FIG. 12 is a cross-sectional view along the E-E line shown in FIG. 11.

In Embodiment 1, the conductive film formed forming the signal wirings 6 is superior in corrosion resistance to that forming the scan wirings 2. In Embodiment 2, this relationship is reversed, i.e., a conductive film forming scan wirings 2 is superior in corrosion resistance to that forming signal wirings 6. That is a case with, for example, the signal wirings 6 being made of a metal such as Al, Ag, Cu, or an alloy of any thereof, and the scan wirings 2 being made of a more corrosion-resistant metal such as Cr, Mo, Ti, Ta, W or an alloy of any thereof.

Firstly, a portion L around an external-connection terminal 60*a* for a scan wiring 2 will be described. FIG. 9 shows the enlarged plan view of the external-connection terminal 60*a*, and FIG. 10 shows its cross-sectional view along the D-D line shown in FIG. 9.

The external-connection terminal 60*a* for the scan wiring 2 and a scan-wiring lead 2*a* has a two-layer structure, as with Embodiment 1. The lower-layer film is formed from the same layer for the scan wirings 2 and the scan-wiring leads 2*a*, and an external-connection terminal surface film 16 of the upper-layer film is formed from the same layer for the pixel electrodes 11 formed of a transparent conductive oxide film such as of ITO superior in corrosion resistance to a metal film. The external-connection terminal surface film 16 is in contact with the lower-layer film through a contact hole 62*a* formed in the gate insulation film 4 and the protective film 9. On the other hand, the connection wirings 70 to be connected to the common wiring 80 of the adjacent liquid crystal panel 50 are formed from the same layer for the scan wirings 2 and the scan-wiring leads 2*a*. The external-connection terminal surface film 16 is extended and connected with a connection wiring 70 at a transit portion 65*a* through a contact hole 64*a* formed in the protective film 9.

The connection wiring 70 is extended and connected with the common wiring 80 of the adjacent liquid crystal panel 50 through a transit portion 68*a*. The common wiring 80 here is formed from the same layer for the signal wirings 6 and signal-wiring leads 6*b*.

The transit portion 68*a* thus connect the connection wiring 70 with the common wiring 80 of the adjacent liquid crystal panel 50 via a transit film 17 formed from the same layer for the pixel electrodes 11, through a contact hole 66*a* formed in the gate insulation film 4 and the protective film 9 on the connection wiring 70 and through a contact hole 67*a* formed in the protective film 9 on the common wiring 80.

An important feature of this configuration is that the conductive film formed forming the connection wirings 70 is, as described above, superior in corrosion resistance to that forming the signal wirings 6. In other words, in Embodiment 2, the conductive film formed forming the scan wirings 2 is superior in corrosion resistance to that forming the signal wirings 6. That is a case with, for example, the signal wirings 6 being made of a metal such as Al, Ag, Cu, or an alloy of any thereof, and the scan wirings 2 being made of a more corrosion-resistant metal such as Cr, Mo, Ti, Ta, W, or an alloy of any thereof.

Moreover, in this configuration, by locating a cutting line 15, along which the liquid crystal panel 50 is to be cut and separated from the mother substrate, so as to intersect the connection wirings 70, the more corrosion-resistant layer of the connection wirings 70 (the same layer for the scan wirings 2 in this case) is exposed on the cut end, so that corrosion is less likely to occur than the layer of the signal wirings 6 is exposed. Therefore, the display device 100 is improved in reliability.

Furthermore, since the connection wirings 70 are covered with the gate insulation film 4 and the protective film 9 in this configuration, the layer of the connection wirings 70 is harder to peel than Embodiment 1 in the cutting and separating step. Moreover, even if a connection wiring 70 is peeled or corroded, influence of the peeling or corrosion can be prevented from extending to an external-connection terminal 60*a* connected therewith because transit portions 65*a* are provided there. Therefore, the display device 100 is further improved in reliability.

As for the common wiring 80 of the adjacent liquid crystal panel 50, even if a connection wiring 70 is peeled or corroded, influence of the peeling and corrosion can also be prevented from extending to the common wiring 80 because transit portions 68*a* are provided there. Therefore, the display device 100 is further improved in reliability.

Next, an explanation will be made on portions M around external-connection terminals 60*b* for the signal wirings 6 and portions N around external-connection terminals 60*c* for the common wiring 80. FIG. 11 is the enlarged plan view illustrating one of the external-connection terminal portions M or N, in Embodiment 2. FIG. 12 is a cross-sectional view along the E-E line shown in FIG. 11.

An external-connection terminal 60*b* for a signal wiring 6 and a signal-wiring lead 6*a*, and an external-connection terminal 60*c* for the common wiring 80 have a two-layer structure, as with Embodiment 1. The lower-layer film is formed from the same layer for the signal wirings 6, for the signal-wiring leads 6*b*, and for the common wiring 80, and an external-connection terminal surface film 16 of the upper-layer film is formed from the same layer for the pixel electrodes 11 formed of a transparent conductive oxide film such as of ITO. The external-connection terminal surface film 16 is in contact with the lower-layer film through a contact hole 62*b* or 62*c* formed in the protective film 9. On the other hand, the connection wirings 70 to be connected to the common wiring 80 of the vertically adjacent liquid crystal panel 50 are formed from the same layer for the scan wirings 2 and the scan-wiring leads 2*a*. The external-connection terminal surface film 16 is connected with a connection wiring 70 at a transit portion 65*b* or 65*c* through a contact hole 64*b* or 64*c* formed in the gate insulation film 4 and the protective film 9.

Thus, the external-connection terminals 60*b* for the signal wirings 6 and the external-connection terminals 60*c* for the common wiring 80 are different only in their lower-layer film configurations from the external-connection terminals 60*a* for the scan wirings 2. Hence, all the connection wirings 70 have the same effect as the external-connection terminals 60*a* for the scan wirings 2 have. Therefore, the display device 100 is improved in reliability.

In addition, if the lower-layer film of the external-connection terminals 60*b* for the signal wirings 6 are formed from the same layer for the scan wirings 2, the terminals may be formed in the same configuration as that of the external-connection terminals 60*a* for the scan wirings 2, as shown in above-described FIGS. 9 and 10.

Similarly, if the lower-layer film of the external-connection terminals 60*c* for the common wirings 80 are formed from the same layer for the scan wirings 2, the terminals may also be formed in the same configuration as that of the external-connection terminals 60*a* for the scan wirings 2, as shown in above-described FIGS. 9 and 10.

Embodiment 3

While in Embodiments 1 and 2 the common wiring 80 and the signal wirings 6 are formed from the same layer, in Embodiment 3 common wiring 80 and scan wirings 2 are formed from the same layer. The configurations of external-connection terminals 60 and connection wirings 70 are essentially the same as with Embodiments 1 and 2.

Figure 13:
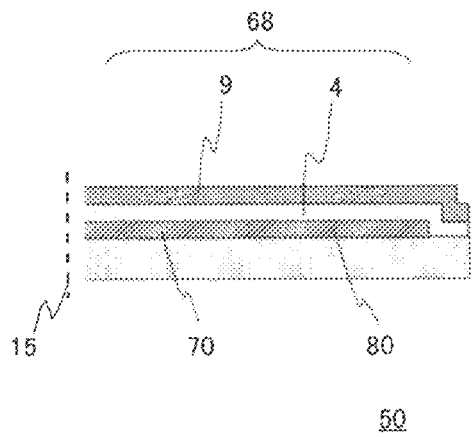
FIG. 13 is an enlarged cross-sectional view illustrating a transit portion (connecting portion) in Embodiment 3, between a connection wiring and a common wiring both being formed from the same layer of scan wirings.
Figure 14:
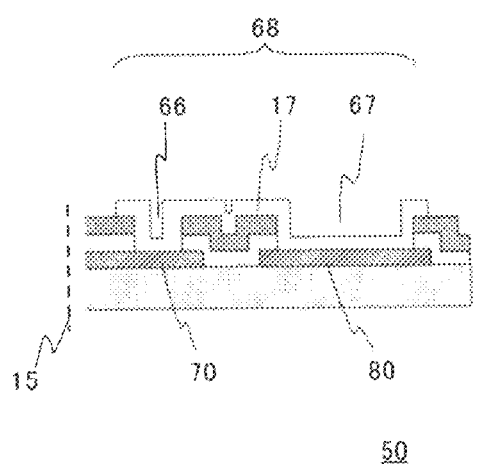
FIG. 14 is an enlarged view illustrating another transit portion in Embodiment 3, between the connection wiring and the common wiring both being formed from the same layer of the scan wirings.

FIG. 13 is an enlarged cross-sectional view illustrating a transit portion (connecting portion) between a connection wiring and a common wiring both being formed from the same layer for scan wirings and the common wiring. FIG. 14 is an enlarged cross-sectional view illustrating another transit portion between the connection wiring and the common wiring both being formed from the same layer for the scan wirings.

In FIG. 13, a connection wiring 70 and the common wiring 80 of the adjacent liquid crystal panel 50 both being formed from the same layer for the scan wirings 2 are continuously connected directly with each other at the transit portion (connecting portion) 68.

In FIG. 14, the connection wiring 70 and the common wiring 80 both being formed from the same layer for the scan wirings 2 are connected with each other at the another transit portion 68 via contact holes 66 and 67 formed on the connection wiring 70 and the common wiring 80, respectively, through a transit film 17 formed from the same layer for the pixel electrodes 11.

The configuration shown in FIG. 13 is superior to that in FIG. 14 in connection resistance across the connection wiring 70 and the common wiring 80. Namely, the configuration in FIG. 14 is inferior to that in FIG. 13 in connection resistance thereacross, because the transit film 17 interposed therebetween at the transit portion 68. However, according to this configuration of FIG. 14, even if peeling or corrosion occurs in a connection wiring 70, influence of the peeling or the corrosion can be prevented more effectively from extending to the common wiring 80 than the configuration of FIG. 13, because the transit films 17 are provided at the transit portions 68.

Figure 15:
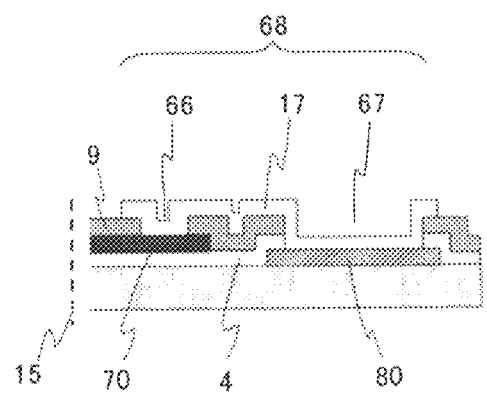
FIG. 15 is an enlarged cross-sectional view illustrating still another transit portion in Embodiment 3, between the connection wiring and the common wiring both being formed from the same layer of the signal wirings.

FIG. 15 is an enlarged cross-sectional view illustrating still another transit portion 68 between the connection wirings and the common wiring both being formed from the same layer for the signal wirings 6. Whereas FIGS. 13 and 14 show the cases of the connection wirings 70 being formed in the same layer of the scan wirings 2, FIG. 15 shows a case of the connection wirings 70 being formed from the same layer for the signal wirings 6.

A connection wiring 70 formed from the same layer for the signal wirings 6 is connected with the common wiring 80 formed from the same layer for the scan wirings 2 at the transit portion 68 by means of a transit film 17 formed from the same layer for the pixel electrodes 11, via a contact hole 66 formed on the connection wirings 70 and a contact hole 67 formed on the common wiring 80.

In this case also, even if peeling or corrosion occurs in a connection wiring 70, influence of the peeling or corrosion can be prevented from extending to the common wiring 80, as with the configuration of FIG. 14, because the transit films 17 are provided at the transit portions 68.

In Embodiment 3, although the layer configuration of the common wiring 80 is different from Embodiments 1 and 2, all the connection wirings 70 exhibit the same effect as in Embodiment 1 and 2. Therefore, the display device 100 is improved in reliability.

Embodiment 4

While in Embodiments 1 through 3 the connection wirings 70 are formed from the same layer for the scan wirings 2 or the signal wirings 6, in Embodiment 4 connection wirings 70 are formed from the same layer for pixel electrodes 11.

Figure 16:
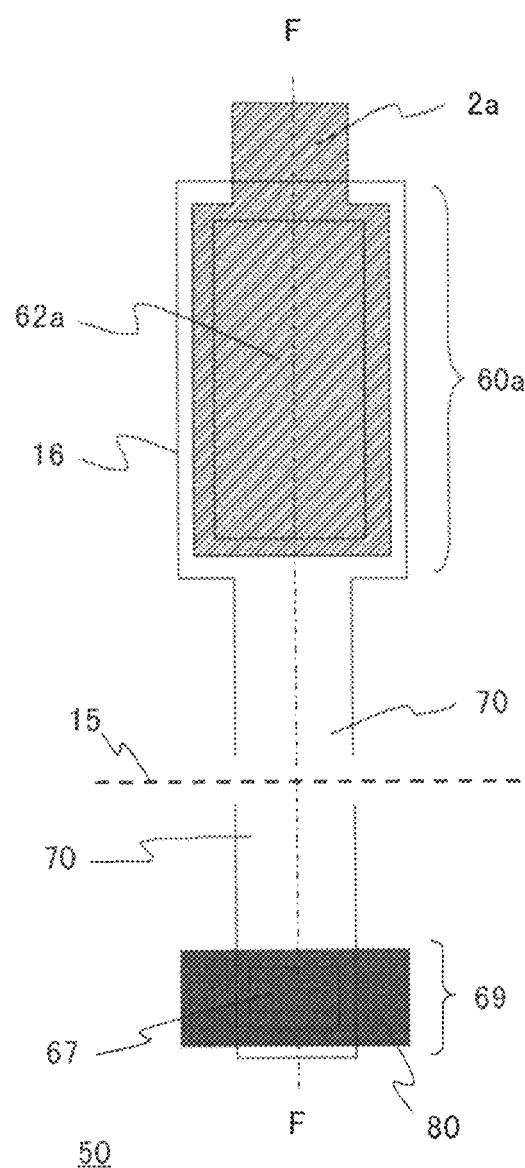
FIG. 16 is an enlarged plan view illustrating an external-connection terminal portion L in Embodiment 4, for scan wirings.
Figure 17:
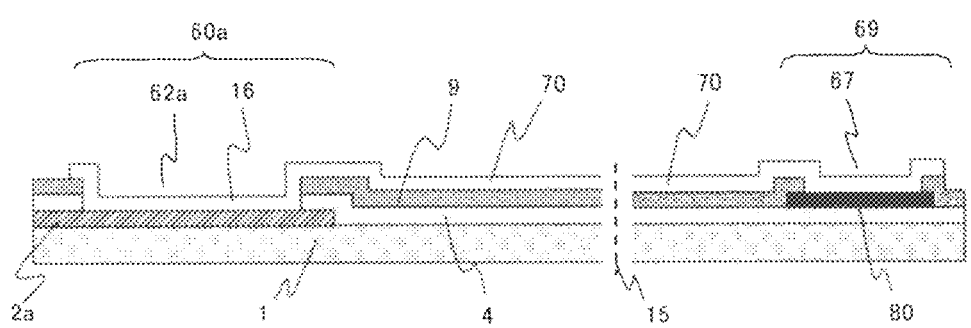
FIG. 17 is a cross-sectional view along the F-F line shown in FIG. 16.

FIG. 16 is an enlarged plan view illustrating an external-connection terminal portion L in Embodiment 4, for scan wirings. FIG. 17 is a cross-sectional view along the F-F line shown in FIG. 16.

In FIGS. 16 and 17, an external-connection terminal 60a for scan wiring 2 and scan-wiring lead 2a has a two-layer structure as with Embodiment 1 through 3. In Embodiment 4, the lower-layer film of the external-connection terminal 60a is connected through a contact hole 62a with an external-connection terminal surface film 16 formed from the same layer for the pixel electrodes 11 made of a transparent conductive oxide film such as of ITO. The external-connection terminal surface film 16 is extended as a connection wiring 70 to the adjacent liquid crystal panel 50, and connected directly to common wiring 80 formed from the same layer for signal wirings 6, through a contact hole 67 at a connecting portion 69.

In general, a conductive oxide film, irrespective of being transparent or opaque, is superior in corrosion resistance, but higher in ohmic resistance, to a metal film that is used for the scan wirings 2 and the signal wirings 6. Hence, if more importance is placed on corrosion resistance of the connection wirings 70 to be exposed on a cut end of the liquid crystal panel 50, it is desirable that all the connection wirings 70 be formed of a conductive oxide film such as of ITO.

In addition, as for external-connection terminals 60b for the signal wiring 6 and external-connection terminals 60c for the common wiring 80, although not shown in Embodiment 4, their external-connection terminal surface films 16 formed of a conductive oxide film are also extended as the connection wirings 70 and directly connected, as shown in FIG. 17, to the common wiring 80 of the adjacent liquid crystal panel 50 through contact holes 67 at connecting portions 69 of these terminals.

Even if the lower-layer films of the external-connection terminals 60b, and the external-connection terminal 60c are formed from the same layer for the scan wirings 2, or the common wirings 80 are formed from the same layer for the scan wirings 2, all the connection wirings 70 can be formed essentially in the same configuration except only for differences in depth of contact holes 62b and 62c, and 67 of external-connection terminal surface films 16 and transit films 17 both formed of the conductive oxide film.

Similarly, even if the lower-layer film of external-connection terminals 60a for the scan wiring 2 are formed from the same layer for the signal wirings 6, all the connection wirings 70 can be formed essentially in the same configuration except only for differences in depth of contact holes 62a of the external-connection terminal surface films 16 formed of the conductive oxide film.

In Embodiment 4, all the connection wirings 70 are thus formed from the same layer for the pixel electrodes 11, that is, all the connection wirings 70 are formed of a transparent conductive oxide film such as of ITO, which is superior in corrosion resistance to a metal film used for the scan wirings 2 or the signal wirings 6. Therefore, the display device 100 is further enhanced in reliability than Embodiments 1 through 3.

Moreover, even in a case of the pixel electrodes 11 not being formed only of a transparent conductive oxide film, if they have conductive layers that are more corrosion-resistance than a metal film used for the scan wirings 2 and the signal wirings 6, forming the connection wirings 70 from these conductive layers improves more in corrosion resistance than Embodiments 1 through 3. Therefore, the display device 100 is further enhanced in reliability.

Embodiment 5

Figure 18:
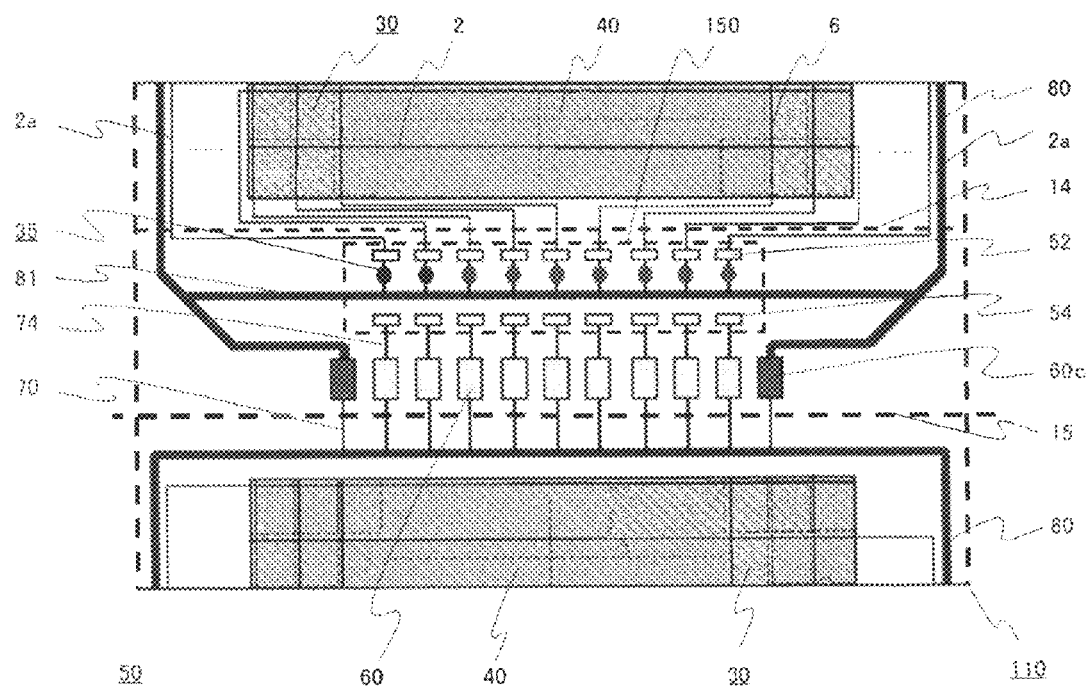
FIG. 18 is an enlarged plan view illustrating a region around a cutting line of an array substrate in Embodiment 5, along which to cut the array substrate into the individual vertically-adjacent liquid crystal panels.
Figure 19:
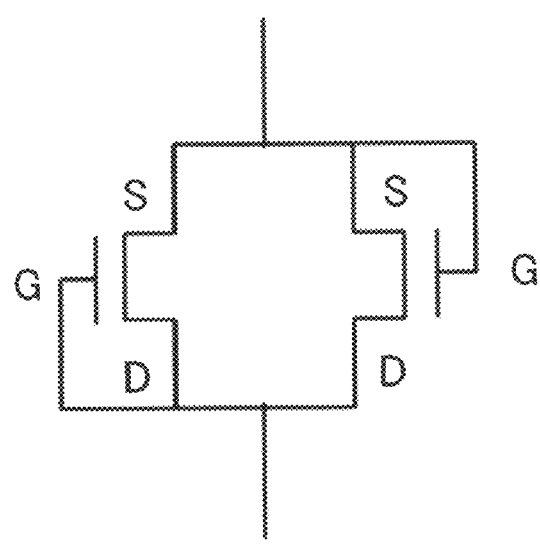
FIG. 19 is an equivalent circuit illustrating one of protection circuits shown in FIG. 18.

FIG. 18 is an enlarged plan view of a region around a cutting line of an array substrate in Embodiment 5, along which to cut the array substrate into individual vertically-adjacent liquid crystal panels. FIG. 19 is an equivalent circuit illustrating one of protection circuits shown in FIG. 18.

In Embodiments 1 through 4, the scan wirings 2 and the signal wirings 6 are connected to the driver circuit (driver IC) and the external circuit through the external-connection terminals 60. In Embodiment 5, a driver circuit is mounted directly on an array substrate 110 (so-called "chips on glass").

In FIG. 18, a driver circuit (driver IC) 150 is mounted directly on the array substrate 110 using a chip-on-glass technique, and its mounting area is indicated by a broken line. On the array substrate 110, driver-circuit output terminals 52 and driver-circuit input terminals 54 are formed in positions corresponding to the output and input bump electrodes of the driver circuit 150. The driver-circuit output terminals 52 and the driver-circuit input terminals 54 here have essentially the same two-layer structure as the external-connection terminals 60 shown in Embodiments 1 through 4.

An auxiliary common wiring 81 that is branched from a common wiring 80 is formed between the driver-circuit output terminals 52 and the driver-circuit input terminals 54. The respective driver-circuit output terminals 52 are connected with the auxiliary common wiring 81 through the protection circuits 35. In a manufacturing step prior to that of mounting the driver circuit 150, the driver-circuit output terminals 52 connected with scan wirings 2 and signal wirings 6 are also connected with the auxiliary common wiring 81 through the protection circuits 35, and the auxiliary common wiring 81 is further connected with the common wiring 80. The driver-circuit input terminals 54 are connected with external-connection terminals 60 through driver-circuit input wirings 74.

The common wiring 80 is, as with Embodiments 1 through 4, connected with external-connection terminals 60c and further connected to the other common wiring 80 of the adjacent liquid crystal panel 50 through the connection wirings 70.

FIG. 19 shows the equivalent circuit of one of the protection circuits 35, in which two non-linear diodes each are basically composed of a thin film transistor whose gate electrode G is connected with its source electrode S or its drain electrode D, and are arranged in parallel with their conductive directions opposite to each other. While little currents flow in the diodes under normal conditions because of their high ohmic resistance, when a high voltage due to static electricity happens to apply to the diodes, a current flows through either one of the diodes depending upon the polarity of the static electricity. In this way, even if static electricity happens to occurs in a scan wiring 2 or a signal wiring 6, it can be discharged through the protection circuit 35 from the wiring to the auxiliary common wiring 81 and further to the common wiring 80.

In place of providing the protection circuits 35, high ohmic resistance films made of a semiconductor film or the like may be provided that allow little currents flowing therethrough under the normal driving voltage.

In this embodiment, the external-connection terminals 60 and 60c, and all the connection wirings 70 can be configured as the same as any of Embodiments 1 through 4. In particular, by forming in a configuration similar to Embodiments 1 through 4 the external-connection terminals 60c and the connection wirings 70 both connected to the common wiring 80, the same effect can be brought about as in Embodiments 1 through 4.

Embodiment 6

Figure 20:
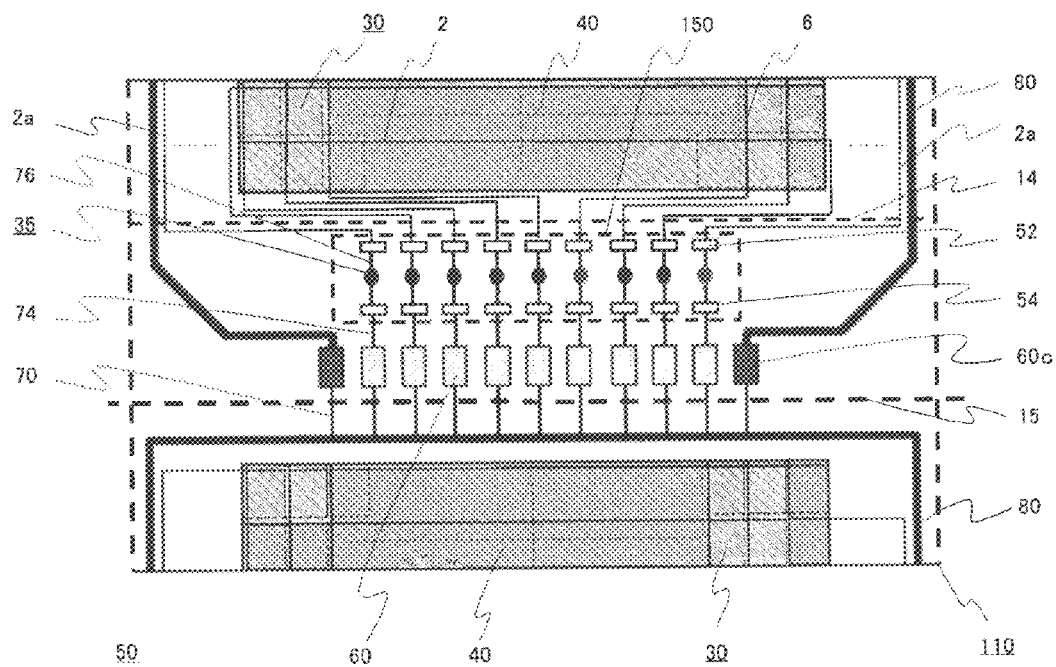
FIG. 20 is an enlarged plan view illustrating a region around a cutting line of an array substrate in Embodiment 6, along which to cut the array substrate into individual vertically the adjacent liquid crystal panels.

FIG. 20 is an enlarged plan view illustrating a region around a cutting line of an array substrate in Embodiment 6, along which to cut the array substrate into individual vertically-adjacent liquid crystal panels.

In Embodiment 6, there is no auxiliary common wiring 81, and driver-circuit output terminals 52 and driver-circuit input terminals 54 are connected with each other through driver-circuit input/output-terminal connection wirings 76 that are provided in their midway position with protection circuits 35. In a manufacturing step prior to that of mounting a driver circuit 150, the driver-circuit output terminals 52 connected with scan wirings 2 and signal wirings 6 are also connected with the driver-circuit input terminals 54 through the driver-circuit input/output-terminal connection wirings 76.

While, in FIG. 20, the driver-circuit input/output-terminal connection wirings 76 with the protection circuits 35 connect the driver-circuit output terminals 52 in one-to-one correspondence with the driver-circuit input terminals 54, driver-circuit input/output-terminal connection wirings 76 with the protection circuits 35 may be provided each to connect a plurality of the driver-circuit output terminals 52 to one driver-circuit input terminal 54.

In this case, it is desirable that each driver-circuit input/output-terminal connection wiring 76 be connected with the driver-circuit input terminal 54 and the driver-circuit output terminals 52 whose normal operation potentials are as nearly the same as possible. This is due to the fact that if the driver-circuit input terminal 54 and a driver-circuit output terminal 52 are different in their normal operation potentials, a small leakage current is likely to flow therebetween.

External-connection terminals 60 are connected with the driver-circuit input terminals 54 by means of driver-circuit input wirings 74, and connected to the common wiring 80 of the adjacent liquid crystal panel 50 by means of connection wirings 70 extended from the external-connection terminals 60.

The common wiring 80 are connected, similarly to Embodiments 1 through 5, with external-connection terminals 60c, and further connected to the common wiring 80 of the adjacent liquid crystal panel 50 through the connection wirings 70.

Here, by forming in the same configuration as any of Embodiments 1 through 5 all the connection wirings 70 from the external-connection terminals 60 and 60c, the same effect can be brought about as in Embodiments 1 through 5.

In above Embodiments 1 through 6, if auxiliary connection wirings 72 are provided to connect, as shown FIG. 1, between a common wiring 80 and those of right-and-left adjacent liquid crystal panels 50, the auxiliary connection wirings 72 are also necessarily located to intersect cutting lines 15, which would cause a similar corrosion problem also on the auxiliary connection wirings 72. Therefore, the auxiliary connection wirings 72 are desirably formed in the same layer of connection wirings 70.

Up to this, array substrates and display devices have been described in Embodiments 1 through 6, each taking a liquid crystal display device as an example. The array substrate and the display device of the invention are applicable to not only a liquid crystal display device but also a self-emission display device such as an electroluminescence display and a field emission display, and a reflection-type display device such as an electronic paper that utilizes fine particles or oil particles.

What is claimed is:

1. An array substrate having on an insulative substrate, a plurality of display areas to be portions of a plurality of display panels, each display area being constituted with a plurality of pixels arranged in a matrix, the pixels having pixel electrodes formed at intersection portions of plural scan wirings and plural signal wirings; a common wiring formed outside each display area, for applying a reference voltage to the pixels; and a plurality of external-connection terminals formed outside each display area, to be connected with a driver circuit that drives the display panel; the array substrate comprising:

connection wirings located so as to intersect a cutting line along which the insulative substrate is to be cut, for connecting the external-connection terminals in one of the display panels on the insulative substrate with a common wiring in another one of the display panels adjacent to the external-connection terminals, wherein the connection wirings and the external-connection terminals are connected via transit portions comprising conductive material, the transit portions comprising elements other than the external-connection terminals and the connection wirings, the transit portions being joined to the external-connection terminals at a joint and joined to the connection wirings at another joint, and wherein the connection wirings are formed from a conductive layer superior in corrosion resistance to at least one of the conductive layers constituting the scan wirings and the signal wirings, wherein at least one of said joints comprises a contact hole.

2. The array substrate of claim 1, wherein all the connection wirings are formed from the most corrosion-resistant conductive layer among conductive layers that form the scan wirings, signal wirings, and the common wiring.

3. The array substrate of claim 1, wherein all the connection wirings are formed from the layer for the pixel electrodes.

4. The array substrate of claim 1, wherein all the connection wirings are formed of a conductive oxide film.

5. A display device assembled from a display panel having been cut and separated from the array substrate of claim 1.

6. The array substrate of claim 1, wherein the conductive material is transparent conductive oxide material.

7. The array substrate of claim 1, wherein the connection wirings are covered with protection material.

8. The array substrate of claim 1, wherein the connection wirings are narrower than the transit portions.

9. An array substrate having on an insulative substrate, a display area being constituted with a plurality of pixels arranged in a matrix, the pixels having pixel electrodes formed at intersection portions of plural scan wirings and plural signal wirings; a common wiring formed outside the display area, for applying a reference voltage to the pixels; and a plurality of external-connection terminals formed outside the display area, to be connected with a driver circuit that drives the display area; the array substrate comprising:

connection wirings extending toward an edge of the insulative substrate, wherein the connection wirings and the external-connection terminals are connected via transit portions comprising conductive material, the transit portions comprising conductive material, wherein the transit portions comprising elements other than the external-connection terminals and the connection wirings, the transit portions being joined to the external-connection terminals at a joint and joined to the connection wirings at another joint, and wherein the connection wirings are formed from a conductive layer superior in corrosion resistance to at least one of the conductive layers constituting the scan wirings and the signal wirings, wherein at least one of said joints comprises a contact hole.

10. The array substrate of claim 9, wherein the connection wirings are formed from the most corrosion-resistant conductive layer among conductive layers that form the scan wirings and the signal wirings.

11. The array substrate of claim 9, wherein the connection wirings are formed from the layer for the pixel electrodes.

12. The array substrate of claim 9, wherein the connection wirings are formed of a conductive oxide film.

13. A display device assembled from a display panel comprising the array substrate of claim 9.

14. The array substrate of claim 9, wherein the conductive material is transparent conductive oxide material.

15. The array substrate of claim 9, wherein the connection wirings are covered with protection material.

16. The array substrate of claim 9, wherein the connection wirings are narrower than the transit portions.

* * * * *